United States Patent
Ohkawa

[19]

[11] Patent Number: 6,014,203
[45] Date of Patent: Jan. 11, 2000

[54] DIGITAL ELECTRON LITHOGRAPHY WITH FIELD EMISSION ARRAY (FEA)

[75] Inventor: Tihiro Ohkawa, La Jolla, Calif.

[73] Assignee: Toyo Technologies, Inc., La Jolla, Calif.

[21] Appl. No.: 09/013,170

[22] Filed: Jan. 27, 1998

[51] Int. Cl.[7] .............................. G03B 27/74; G01K 1/08; A61N 5/00
[52] U.S. Cl. ........................ 355/68; 250/398; 250/492.2
[58] Field of Search ...................... 315/39.51; 250/492.2, 250/423, 505.1, 492.22, 213, 492.23; 355/68; 430/296; 313/309

[56] References Cited

U.S. PATENT DOCUMENTS

| | | | |
|---|---|---|---|
| 4,695,732 | 9/1987 | Ward | 250/492.2 |
| 4,990,766 | 2/1991 | Simms et al. | 250/213 |
| 5,395,738 | 3/1995 | Brandes et al. | 430/296 |
| 5,554,854 | 9/1996 | Blake | 250/492.2 |
| 5,676,873 | 10/1997 | Takase et al. | 315/39.51 |
| 5,689,117 | 11/1997 | Nakasuji | 250/492.23 |
| 5,698,934 | 12/1997 | Jin et al. | 313/309 |
| 5,747,815 | 5/1998 | Young et al. | 250/423 |

OTHER PUBLICATIONS

Stix, Gary, Toward "Point One", *Scientific American*, Feb., 1995, pp. 90–95.

*Primary Examiner*—Safet Metjahic
*Assistant Examiner*—Peter Kim
*Attorney, Agent, or Firm*—Nydegger & Associates

[57] ABSTRACT

A digital electron lithography system includes a plurality of cathodes oriented in a plane and positioned substantially parallel to a substrate surface in a vacuum chamber. The substrate surface is coated with a layer of an electron resist material and, in operation, individual cathodes in the array are selectively activated to emit electrons which alter the resist material. In order to create a predetermined pattern on the substrate, a focusing magnet is provided to direct the electrons from the respective cathodes to be focused on the substrate surface along substantially parallel electron paths. Additionally, a steering magnet is provided to change electron path directions so that electrons are steered to sequentially affect a plurality of pixels in a pixel matrix on the substrate surface. To minimize ion damage to the cathodes the electron paths are oriented at an angle to the perpendicular direction between the plane of the array and the substrate surface. Further, to compensate for defective cathodes, a preprogrammed sequence of cathode activation is accomplished whereby active cathodes affect the pixel matrices of adjacent defective cathodes.

10 Claims, 3 Drawing Sheets

DIGITAL ELECTRON LITHOGRAPHY WITH FIELD EMISSION ARRAY (FEA)

FIELD OF THE INVENTION

The present invention pertains generally to electron lithography. More particularly, the present invention pertains to a system for digital electron lithography which uses a field emission array comprising a plurality of cathodes. The present invention pertains particularly, but not exclusively, to systems which simultaneously control a plurality of cathodes during the fabrication of integrated circuits on semiconductor wafers.

BACKGROUND OF THE INVENTION

Presently there are several well known methods for fabricating integrated circuits on semiconductor wafers. In general, all methods somehow alter the surface of the wafer (i.e. substrate) to create the pattern of the integrated circuit on the surface. Of the presently known methods, perhaps the most well known and widely used methods involve either optical lithography systems, electron beam exposure systems (EBES), or electron projection systems (EPS). All of these systems, however, have certain functional limitations which affect their utility.

Optical lithography systems rely on photographic projections of the integrated circuit pattern on the substrate surface. As optical systems which rely on light to define the circuit pattern, however, they are limited in their resolution by the wavelength of light. Effectively, if the feature size is smaller than approximately two tenths of a micron (<~0.2μm) optical imaging is no longer useful. Although EBES type systems can provide better resolution than optical lithography systems for small feature sizes, since they do not have the wavelength limitations of optical lithography, their speed of operation is relatively slow. This is due to the fact that in an EBES type system one electron source must sequentially address each pixel in the integrated circuit pattern. For this reason, EBES type systems have not generally been used for the fabrication of semiconductor wafers. Instead, EBES type systems have been limited to the fabrication of masks which can be subsequently used in other type systems to fabricate semiconductor wafers. Unlike either optical lithography or EBES systems, EPS type systems have both good feature resolution and speed of operation. Present EPS type systems, however, have a very short operational life (less than fifty exposures). Furthermore, reconstruction of an EPS system must generally be accomplished in situ, and it is typically quite a cumbersome task.

The present invention has realized that a field emission array (FEA), of a type generally known in the pertinent art, can be incorporated into a digital electron lithography (DEL) system and, thereby, overcome limitations of the various systems discussed above. This incorporation, however, presents certain difficulties which must also be overcome in order to provide a system which is capable of rapidly and repeatedly generating high resolution patterns in a sustained operation. Specifically, a focusing component is required for the system which will direct electrons onto a substrate with such precision that the spot size of the focused electrons is smaller than the size of the pixel to be produced. Additionally, because each cathode in the FEA is significantly larger than the size of individual pixels in the pattern to be produced, each cathode must affect more than one pixel and, therefore, each cathode must be individually scanned to affect a plurality of pixels in a pixel matrix. Further, the electron energy must be sufficiently high to appropriately alter the substrate surface. Still further, insofar as the FEA itself is concerned, there are two primary concerns which must be addressed. First, although conventional FEAs require ultra high vacuum operational environments in order to avoid unacceptable deterioration of the cathodes in the FEA, it is preferable if a DEL system is able to operate in conventional vacuums. Second, there needs to be some realistic way in which to compensate for defective cathodes in the FEA.

In light of the above it is an object of the present invention to provide a digital electron lithography system which is capable of rapidly and repeatedly generating high resolution patterns on the surface of a substrate in a sustained operation. Another object of the present invention is to provide a digital electron lithography system which focuses electrons to spot sizes on a substrate which are smaller is size than the pixel being produced. Still another object of the present invention is to provide a digital electron lithography system which steers electrons from each individual cathode in a field emission array toward a plurality of pixels in a pixel matrix. Yet another object of the present invention is to provide a digital electron lithography system which can use a field emission array in a conventional vacuum environment. Also, another object of the present invention is to provide a digital electron lithography system which has the capability of first determining where there are defective cathodes in a field emission array and, then, compensating for these defective cathodes during operation of the system.

SUMMARY OF THE PREFERRED EMBODIMENTS

A digital electron lithography system, in accordance with the present invention, includes a field emission array (FEA) which includes a plurality of cathodes that are arranged in rows and columns in any x-y plane. For the present invention, the cathodes in the FEA may include gate electrodes and be electronically activated, or they may include photodiodes and be optically activated. In either case, all cathodes in the FEA are of the same type.

As intended for the present invention, the FEA is placed in the chamber of a vacuum vessel along with the substrate that is to be altered by digital electron lithography. Specifically, the cathodes of the FEA are oriented relative to the substrate in the chamber such that the x-y plane of the cathodes is distanced from and substantially parallel to the surface of the substrate that is to be altered. Preferably, the vacuum in the vessel is established at approximately $10^{-7}$ Torr.

Two separate magnetic arrangements are used with the digital electron lithography system of the present invention. One is a focusing magnet which is positioned to generate a uniform magnetic field having a field strength ($B_z$) in the range of approximately 1–3 Tesla. Specifically, this uniform magnetic field is established between the FEA and the substrate surface with its magnetic field strength lines aligned generally in a z direction relative to the x-y plane of the FEA. Stated differently, the field lines of the uniform magnetic field are oriented substantially perpendicular to the FEA and to the surface of the substrate that is to be altered by the FEA. Due to the magnetic field of the focusing magnet, electrons that are emitted from selectively activated cathodes in the FEA are directed along substantially parallel respective electron paths to be focused on the substrate surface.

The second magnetic arrangement in the digital electron lithography system of the present invention is a steering magnet which imposes x and y components on the magnetic field of the focusing magnet. As intended for the present invention, these x and y gradients are changed in accordance with a preprogrammed sequence to influence the magnetic field of the focusing magnet, and thereby simultaneously steer the electrons from each of the cathodes along their respective mutually parallel electron paths. There, under the influence of the steering magnet, all of the electron paths are simultaneously reoriented or steered while maintaining their parallel relationship to each other. Consequently, because each cathode must affect a plurality of pixels in a pixel matrix on the substrate, the electrons from all of the activated cathodes in the FEA are directed or steered sequentially toward the various pixels in their respective pixel matrices on the substrate surface. The desired circuit pattern is then created on the substrate surface from the combination of pixel matrices that result as each particular cathode is appropriately activated or deactivated while it is being steered.

An important feature of the present invention is its ability to compensate for defective cathodes in the FEA. Ideally, all cathodes of the FEA are operational. This, of course, is not likely to happen when there may be as many as $2.5 \times 10^7$ cathodes per square centimeter in the FEA. Due to the very high probability there will be some defective cathodes in the FEA, the basic idea of the present invention is to have operationally effective cathodes compensate for any defective cathodes that are adjacent to the effective cathode. This compensation is accomplished by a scheme which requires obtaining the x-y addresses of all defective cathodes in the FEA and then reactivating effective cathodes to generate the pixel matrix which would otherwise have been generated by the defective neighbor cathode.

In the operation of the present invention, all defective cathodes are identified by their x-y address. The steering magnet is then initially activated so that each cathode produces the plurality of pixels within its dedicated (first) pixel matrix on the substrate surface. All of the defective cathodes, however, have been ineffective for this purpose. Consequently, the dedicated (first) pixel matrices of defective cathodes in the FEA are unaffected. In order to help compensate for this deficiency, the steering magnet is activated to realign the electron paths of all cathodes. Specifically, with this realignment, the electrons from all cathodes are focused onto a pixel matrix that was originally dedicated to an adjacent cathode. For example, consider this first shift of the electron paths to be in the +x direction. The FEA is then activated so that all cathodes which are now focused onto the dedicated pixel matrix of a defective +x cathode are activated. The activated cathodes then generate the pixels in the pixel matrix of its defective neighbor cathode in the +x direction. This, however, may still leave unaffected pixel matrices on the substrate surface.

In order to minimize the number of unaffected pixel matrices on the substrate surface, the process of focusing each cathode onto the dedicated pixel matrix of a neighbor cathode can be repeated as required. Preferably, after focusing has been accomplished in the +x direction, repetitions are made sequentially in the +y direction, the −x direction, and then the −y direction. During each such repetition, unless the cathode is focused onto a pixel matrix which was previously affected during an earlier exposure, the cathode is activated to generate the pixel matrix on the substrate surface.

For the embodiment of the present invention wherein the cathodes of the FEA have gate electrodes, each cathode can be electronically activated as required to accomplish the system operation. For the embodiment of the present invention wherein the cathodes of the FEA include photodiodes, it is to be appreciated that a series, or sequence, of digital light images need to be projected onto the photodiodes of the FEA for each pixel matrix. This requires that the projection of these digital light images be coordinated with the operation of the steering magnet so that the respective cathodes are selectively activated for proper generation of each pixel in the pixel matrix. The method of compensation for defective cathodes discussed above is the same regardless of the type cathode that is used.

An important aspect of the present invention is that by properly orienting the paths of the electrons which are emitted from the cathodes, the deleterious effects of "sputtering" can be minimized. Specifically, this is accomplished by inclining the electron paths between the cathode plane and the surface of the substrate. This can be accomplished either by a tilting of the uniform magnetic field or by an adjustment in the steering magnet system. In either case, the electron paths are established with a polar angle component ($\theta$) and an azimuthal angle component ($\phi$) so that their projection onto the cathode plane avoids overlying a cathode. Consequently, in the event an electron collides with a residual gas atom to create an ion in the region between the cathode plane and the substrate surface, the resulting ion will be accelerated by the electric field ($E_a$) toward an area on the cathode plane which avoids collision, and consequent damage, to any of the cathodes in the FEA.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENT

Figure 1:
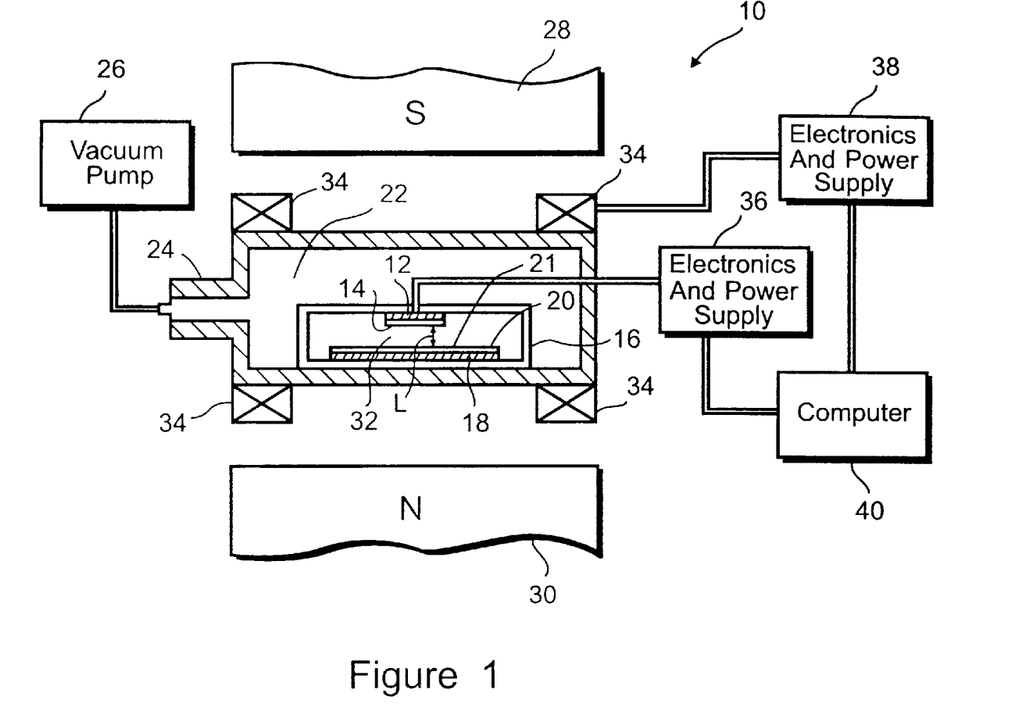
FIG. 1 is a schematic diagram of a digital electron lithography system in accordance with the present invention.

Referring initially to FIG. 1, a digital electron lithography system (i.e. EBES) in accordance with the present invention is shown and is generally designated 10. As shown, the system 10 includes a field emission array (FEA) 12 which has a plurality of cathodes 14. Specifically, although the FEA 12 is shown on-edge in FIG. 1, it will be understood that the FEA 12 is substantially flat and that the cathodes 14 are arranged in rows and columns on the FEA 12 in an x-y plane. Using commercially available FEAs 12 it is possible for there to be around $2.5 \times 10^7$ cathode tips 14 per square centimeter.

FIG. 1 also shows that the FEA 12 is mounted on a support 16. Further, FIG. 1 shows that the system 10 includes a substrate 18 which is mounted on the support 16 and that the FEA 12 has a surface 20 which is coated with an electron resist material 21. As is well known, the sensitivity of the electron resist 21 is measured in terms of Coulomb per square centimeter or, equivalently, Amp-sec per square centimeter, and this sensitivity determines the required exposure time. For the present invention, electron resist materials commercially known as PMMA and PBS are suitable.

In FIG. 1, the substrate 18, like the FEA 12, is shown on-edge. As indicated, the surface 20 of substrate 18 that is oriented substantially parallel to the FEA 12, and the substrate 18 is distanced from the FEA 12 by a distance L. As also indicated in FIG. 1, this relationship is established between the FEA 12 and the substrate 18 inside the chamber 22 of a vacuum vessel 24 substantially as shown. For the operation of the system 10, as more fully disclosed below, the chamber 22 is connected in fluid communication with a vacuum pump 26, and a vacuum is drawn by the pump 26 in the chamber 22 which is equal to approximately $10^{-7}$ Torr.

The system 10 further includes a focusing magnet system which may include a yoke having a S pole face 28 and a N pole face 30. For purposes of the present invention the focusing magnet system may be either a dipole magnet (as depicted in FIG. 1) or it may be a solenoid. In either case, the focusing magnet system is intended to generate a uniform magnetic field in the region 32 between the FEA 12 and the 18. Preferably, the field strength ($B_z$) of the uniform magnetic field in the region 32 will be in the range of from 1–3 Tesla, and the field lines of the magnetic field will be aligned substantially perpendicular to the surface 20 of the substrate 18. Thus, the magnetic field lines will also be substantially perpendicular to the x-y plane of the cathodes 14 in the FEA 12. Stated differently, the field lines of the uniform magnetic field should be aligned substantially in the z direction, relative to the x-y plane of the FEA 12.

A steering magnet 34 is also provided for the system 10. Specifically, the steering magnet 34 includes magnetic coils that are oriented on the vessel 24 in a manner well known to the skilled artisan to generate magnetic fields in both the x and y directions (respectively $B_x$ and $B_y$). As intended for the present invention, the field strength of the steering magnetic fields $B_x$ and $B_y$ is in the range of 1–20 gauss, and these magnetic fields are selectively generated within this range to influence the uniform magnetic field that is generated by the focusing magnet 28,30. The purpose for this control over the uniform magnetic field is more fully discussed below in conjunction with the operation of system 10.

An electronics and power supply unit 36 is provided for the FEA 12 as indicated in FIG. 1. Specifically, one function of this power supply unit 36 is to provide the acceleration voltage ($E_a$) of 1–10 kV between the cathodes 14 of FEA 12 and the surface 20 of substrate 18. Additionally, the power supply unit 36 supplies the column-row scanning voltage of 5–20 volts which, as will be more thoroughly discussed subsequently, is used for the detection of defective cathodes 14. In accordance with the electronics which are contained with the power supply 36, the speed of the shift register for scanning during the defective cathode detection operation is in the range of from 100 MHz–1 GHz. FIG. 1 also shows that the system 10 includes an electronics and power supply unit 38 which controls the steering magnet 34, and a computer 40 which coordinates the operations of the power supply units 36 and 38.

Figure 2:
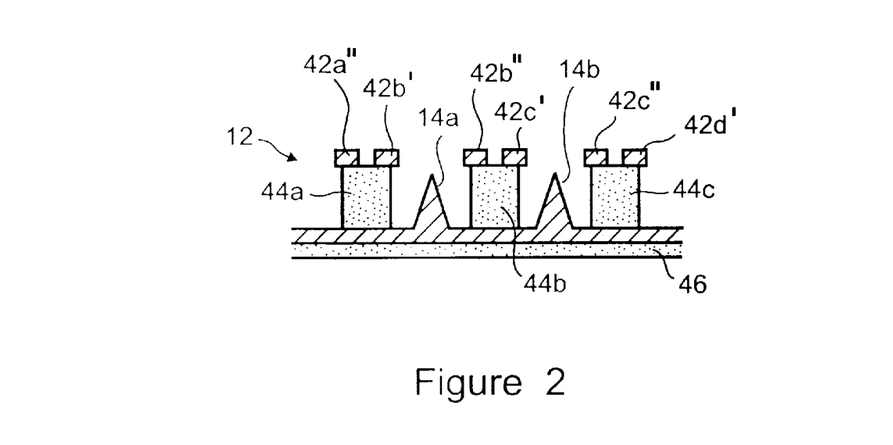
FIG. 2 is a cross sectional view of one type of cathodes which are used in the field emission array of the present invention.

FIG. 2 illustrates one embodiment for the FEA 12 and cathodes 14 which is suitable for the system 10 of the present invention. For this particular type FEA 12, the cathodes 14 are arranged in rows (cathodes 14a and 14b are exemplary), and the corresponding gate electrodes 42 are arranged in columns (electrodes 42a–c are exemplary). More specifically, as shown in FIG. 2, each electrode 42 is positioned around a corresponding cathode 14 so that a voltage of around ten volts between them will cause electron emissions from the cathode 14. Thus, as shown by example in FIG. 2, the electrode designated 42b' and 42bΔ is the gate electrode 42 for the cathode 14a. A dielectric 44 separates the cathodes 14 from the electrodes 42 and an additional layer of dielectric material 46 may be used as a backing for the cathodes 14. As indicated above the electronics and power supply unit 36 controls the selective operation of the cathodes 14 and electrodes 42. Due to the row-column arrangement of the cathodes 14 and electrodes 42, power supply 36 can be operated in a manner well known in the pertinent art to activate only selected cathodes 14.

Figure 3:
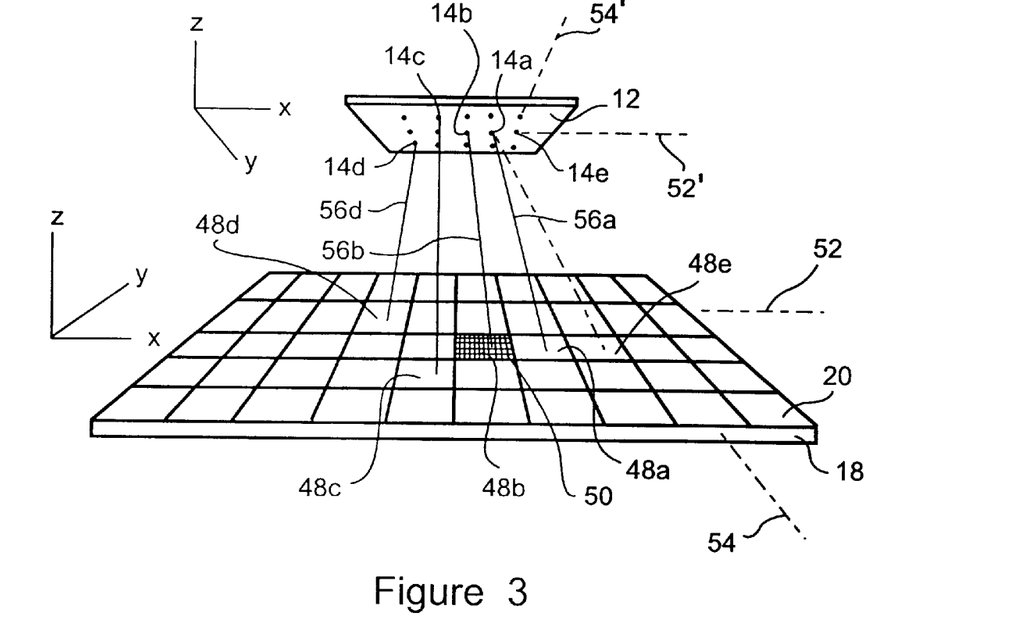
FIG. 3 is a perspective view of portions of the field emission array and the substrate surface as seen from a point therebetween and looking up at the field emission array and down at the substrate surface.

In FIG. 3 it is shown that the surface 20 of substrate 18 can be effectively divided into a plurality of pixel matrices 48. Of these, the pixel matrices 48a–e are exemplary. Further, as shown for the pixel matrix 48b, each pixel matrix 48 contains a plurality of individual pixels 50. Still further, FIG. 3 shows that the pixel matrices 48 are arranged in rows 52 and columns 54 which correspond with rows 52' and columns 54' of individual cathodes 14 in the FEA 12. Specifically, each cathode 14 has a corresponding dedicated pixel matrix 48, while each pixel matrix 48 contains a plurality of pixels 50. As indicated above, there are approximately $2.5 \times 10^7$ cathodes 14 per square centimeter in the FEA 12 and, thus, there are approximately $2.5 \times 10^7$ pixel matrices 48 per square centimeter on the surface 20 of substrate 18. The individual pixels 50 are obviously smaller than the pixel matrix 48, and they are preferably in the sub-micron range. Consequently, each cathode 14 must affect a plurality of different pixels 50.

As shown in FIG. 3, each cathode 14 emits electrons along an electron path 56 that is directed generally toward a dedicated pixel matrix 48 on the substrate 18. For example, when activated, cathode 14a will emit electrons which are then directed along an electron path 56a to be focused on the pixel matrix 48a; cathode 14b will emit electrons toward pixel matrix 48b, and so on. As intended for the present invention, electrons that are emitted from the cathodes 14 are focused onto the substrate 18 by manipulating certain system variables. Specifically, electrons emitted from cathodes 14 can be focused onto the surface 20 of substrate 18 by combining appropriate adjustments of: a) the distance (L) between cathode plane 14 and the surface 20 of substrate 18; b) the magnitude of the magnetic field ($B_z$); and, the magnitude of the accelerating electric field ($E_a$). Because each cathode 14 must affect a plurality of pixels 50 in its corresponding dedicated pixel matrix 48, the spot size of the electrons that are focused onto the surface 20 of substrate 18 is an important consideration. By way of example, it can be mathematically shown that the spot size radius, r, for electron emissions is:

$$r = [-E_c a - \phi]/[-E_a][\alpha^3/2]$$

where:
- α=the angle of the electron's initial velocity from the z axis;
- a=sphere radius of the cathode tip;
- $E_c$=electric field at the surface of the cathode tip;
- φ =work function of the cathode (accounts for electron tunneling); and
- $E_a$=accelerating electric field substantially perpendicular to the substrate surface and cathode plane. With $-E_c a=9$ volts, φ=4 volts, $E_a=10^6$V/m and α=0.16, the spot radius at the focal plane is r~$10^{-8}$m.

An important aspect of the present invention is that the FEA 12 be operated in a conventional vacuum (e.g. $10^{-7}$ Torr) and still avoid cathode degradation by sputtering. For purposes of the present invention, sputtering is considered to primarily result from the ion bombardment of the cathode 14. To avoid this, the present invention takes advantage of two facts. The first is that the orbits of the electrons (i.e. electron paths 56) are strongly affected by the uniform magnetic field $B_z$ of the focusing magnet 28/30. The second is that the paths of any ions that are created in the region 32 between the FEA 12 and the substrate 18 are only negligibly affected by $B_z$. In fact, it happens that due to their greater mass, ions are affected more by the accelerating electric field $E_a$ than they are by the magnetic field $B_z$ which is established between the pole faces 28/30. Consequently, unlike the smaller mass electrons whose electron paths 56 can be easily tilted by shifts in the magnetic field caused by the steering magnet 34, the ion paths are strongly influenced by the electric field $E_a$. Due to this electric influence, ions are directed toward the FEA 12 along paths that remain substantially perpendicular to the x-y plane of the cathodes 14 in FEA 12. The idea then is to steer the electrons which originate at the cathodes 14 along tilted electron paths 56. This is done so that the ions which are produced by collisions between the electrons and the residual gas atoms in the region 32 are accelerated to the energy above the sputtering threshold energy, $W_c$, in the z-direction toward the FEA 12 so as to miss the tips of the cathodes 14. Consequently, cathode degradation by sputtering is avoided or minimized.

Figure 4:
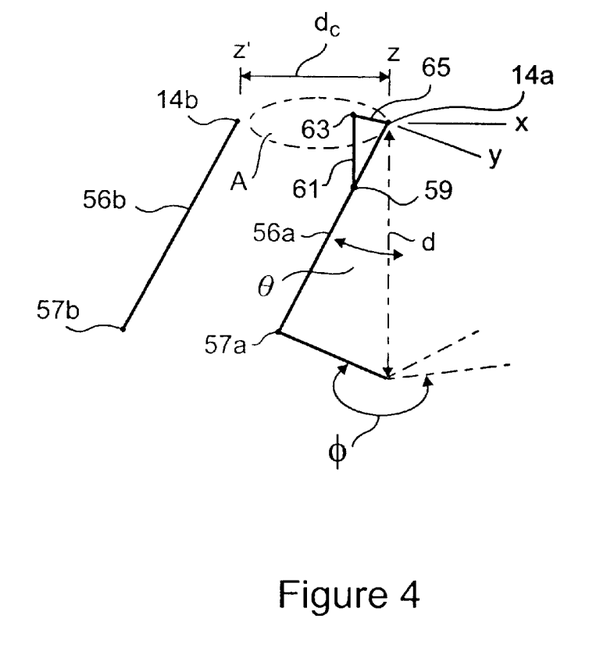
FIG. 4 is a perspective view of a plurality of cathodes in the field emission array with a schematic presentation of the geometry for the electron paths when electrons are emitted from the electrode.

In FIG. 4, by way of example, the cathode 14a is depicted at the origin of an x-y-z axis system and an adjacent neighbor cathode 14b is depicted at the origin of an i'-y'-z' axis system (only the Z' axis shown). The distance between these side-by-side cathodes 14a and 14b, as shown in FIG. 4, is the distance $d_c$. With this configuration, in order for ionized residual gas atoms and molecules in the region 32 to avoid collision with a cathode 14, (either 14a or 14b), the electron path 56a should be tilted from the z direction. Specifically, the electron path 56 needs to be directed with a polar angle component θ, relative to the z direction (the electron path 56 may also be defined by an azimuthal angle component φ, from the x direction). In any event, the polar angle component θ will cause resulting ions to accelerate from the electron path 56 toward an area A that is between the adjacent cathodes 14a and 14b. Stated differently, this will happen when the projection of the electron path lies within the area A shown in FIG. 4. Under these conditions, the ions will avoid colliding with the cathodes 14, and degradation of the cathodes 14 by sputtering is minimized. For example, consider that an electron is emitted from cathode 14a and travels toward a point 57a on substrate 18 along the electron path 56a. If this electron collides with a residual gas atom or a molecule at a point 59 or path 56a, an ion may result. Due to $E_a$, this ion will accelerate along the path 61 and impact the FEA 12 at a point 63 within the area A. So long as such impacts are within the area A, sputtering damage to the cathodes 14 will be avoided. Geometrically, this condition requires the projection 65 of electron path 56 remain within the area A.

To satisfy the conditions under which ion collision with a cathode 14 will be minimized, it can be shown that the cathode separation, $d_c$, the polar angle, θ, and the azimuthal angle, φ, satisfy the following conditions:

$$\theta > -eE_a v_o \sin\alpha/(\Omega W_c);$$

$$d_c > (2v_o \sin\alpha/\Omega)(-eE_a L/W_c)^{1/2};$$

and $$2 v_o \sin\alpha/(d_c \Omega) < \phi < d_c (2L\theta)^{-1}$$

where:

- A=$2[2v_o \sin\alpha/\Omega]L\theta$=projected area (foot print of the electron orbits) on the x-y cathode plane;
- $v_o$=electron velocity;
- α=the angle of the electron's initial velocity from the z axis;
- Ω=cyclotron frequency;
- θ=polar angle component;
- $d_c$=distance between adjacent cathodes;
- $E_a$=accelerating electric field substantially perpendicular to the substrate surface and cathode plane;
- L=distance between x-y cathode plane and substrate surface;
- $W_c$=sputtering threshold energy; and
- φ=azimuthal angle component.

By way of example, with $E_a=-10^6$ V/m, $v_o=6\times10^5$ m/sec, $L=5\times10^{-3}$ m, $W_c=50$ eV, B=3T and sinα=0.05, the conditions are θ>$1.1\times10^{-3}$, $d_c$>$1.1\times10^{-6}$m and $1.1\times10^{-7}$ $d_c^{-1}$<φ<$0.9\times10^5$ $d_c$.

Figure 5:
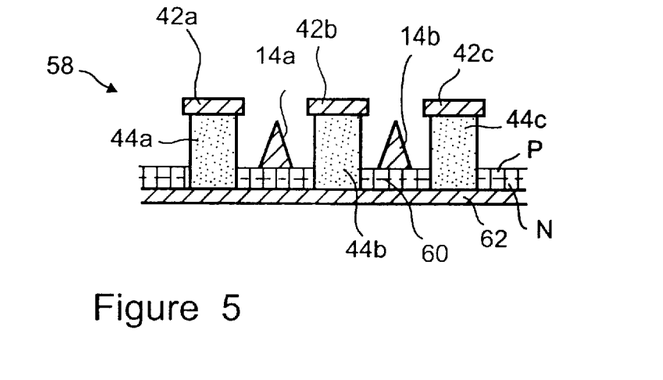
FIG. 5 is a cross sectional view of another type cathode which can be used in the field emission array of the present invention.

In an alternate embodiment for the field emission array, an FEA 58 may be used which incorporates a photodiode rather than the gate electrode used in FEA 12. More specifically, as shown in FIG. 5, the FEA 58 includes a photodiode 60 with a p-i-n junction which is activated whenever light is incident thereon. A transparent layer 62 is used to help direct light onto the p-i-n junction for selective activation of a corresponding cathode 14. A digital electron lithography system 10 (electron projection system—EPS) which incorporates an FEA 58 with photodiodes 60 is quite similar to the system 10 (electron beam exposure system—EBES) which uses an FEA 12 with gate electrodes. As shown by comparing FIG. 1 with FIG. 6, the main difference between the two embodiments for the system 10 is the incorporation of a projection system and its associated optical components.

Figure 6:
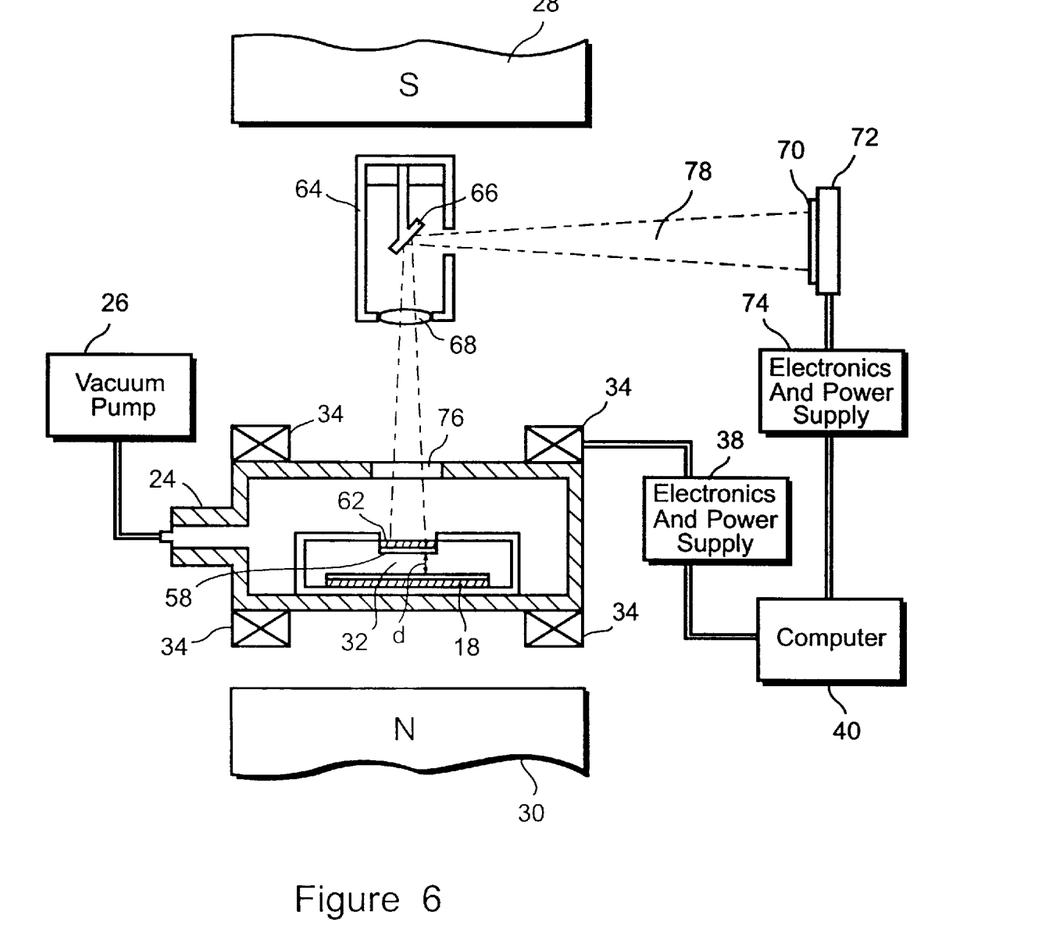
FIG. 6 is a schematic diagram of an alternate embodiment of the digital electron lithography system in accordance with the present invention when cathodes as shown in FIG. 5 are employed.

In FIG. 6 it will be seen that the EPS-type system 10 includes a projector 64 which has a turning mirror 66 and a focusing lens 68. Additionally, as a functional component of the projector 64, a rotating mirror shutter 70 is provided with display panels/light source 72. An electronics and power supply unit 74 is connected between the display panels/light source 72 and the computer 40 so that operation of the projector 64 is coordinated with the other functional elements of the system 10. It is also to be noted that the vacuum vessel 24 is provided with a window 76. Consequently, in accordance with instructions from computer 40, a display panel (there may be 5–25 such panels) of the display panels/light source 72 is illuminated, and the image of the particular display panel 72 is projected on a light beam 78 which is directed by turning mirror 66 and lens 68 through window 76 for incidence on transparent layer 62 of FEA 58. The duration of time during which the display is projected onto the FEA 58 may be in the range of 0.1–1 millisecond.

Operation

In the operation of the digital electron lithography system 10 of the present invention, the first task is to obtain the x-y addresses of defective cathodes 14 in the FEA 12. This is accomplished by selectively energizing all rows 52' and columns 54' on the FEA 12 in a sequence well known in the art. In accordance with this sequence, the current in each cathode 14 can be determined, and cathodes 14 wherein there is no current flow will be considered defective cathodes 14. The x-y addresses of defective cathodes 14 are then processed by the computer 40 for subsequent use.

Once the x-y addresses of defective cathodes 14 have been obtained, the focusing magnet 28/30 is turned on to produce the uniform magnetic field in the region 32 (approximately 1–3 Tesla). The tilt angle θ for the avoidance of sputtering damage is established by either tilting the substrate 18 relative to the FEA 12, or by adding appropriate bias currents to the steering magnets 34. Within this configuration, the steering magnets 34 are set to orient the electron paths 56 from the various cathodes 14 in FEA 12 toward dedicated pixel matrices 48 on the substrate 18. More specifically, the electron path 56 of each cathode 14 in the FEA 12 is directed toward a corresponding pixel 50 in the respective pixel matrix 48. The acceleration voltage of 1–10 KV between the FEA 12 and substrate 18 is turned on and the cathodes 14 of FEA 12 are then selectively activated by computer 40 according to the particular pattern which is being fixed on the substrate 18. Once this is accomplished, the steering magnets 34 are energized by the computer 40 to refocus each cathode along another electron path 56 onto another pixel 50. Again, the cathodes 14 are selectively activated. This main scanning continues until all pixels 50 in each of the respective pixel matrices 48 have been affected (initial exposure).

Recall, some of the cathodes 14 in FEA 12 may be defective. Accordingly, the dedicated pixel matrices 48 of these defective cathodes 14 will not be affected during the initial exposure. Some compensation for this fact is therefore necessary. In order to appreciate the scheme that is used for the present invention to compensate for defective cathodes 14, consider the adjacent cathodes 14a and 14e in FIG. 3. By way of example, consider that the cathode 14a is active and that the cathode 14e is defective. As indicated above, during an initial scan of cathodes 14, the x-y address of the defective cathode 14e will have been obtained and held in computer 40. As will be easily appreciated, during the initial exposure, the pixel matrix 48e that is dedicated to the cathode 14e was not effected. In a second exposure, however, the steering magnets 34 are activated to bias the magnetic field in region 32 so that the electron paths of all active cathodes 14 (e.g. cathode 14a) are shifted to scan one pixel matrix 48 in the +x direction. For the case considered here, during the second exposure, the cathode 14a will emit electrons along electron paths 56 with a scan which causes electrons to focus on pixels 50 in pixel matrix 48e. It should be noted that with the shift in the +x direction, if the cathode 14e had not been previously found to be defective, the cathode 14a would not have been activated. In order to compensate for other defective cathodes 14 which may be adjacent to the cathode 14a, similar shifts in the +y, −x and −y directions are also possible. Also, diagonal shifts can be made. The point is, as many shifts to adjacent pixel matrices 48 as are necessary to generate the desired pattern on substrate 18 may be made. On the other hand, if there are too many defective cathodes 14, the computer 40 may simply indicate that a new FEA 12 should be used before proceeding.

In all important respects, the methods of operation for the EPS-type system 10 is the same as for the EBES-type system 10 discussed above. An important difference, however, is in the manner by which the cathodes 14 are activated. As will be appreciated by reference to FIG. 6, the operation of steering magnets 34 can be coordinated with image projections from display panels/light source 72 by the computer 40. Accordingly, the images of various display panels can be sequentially projected onto the FEA 58 to activate selected cathodes 14. After a sequence of such projections, the desired pattern can be created on the substrate 18.

While the particular digital electron lithography system with field emission array (FEA) as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A digital electron lithography system which comprises:

a plurality of cathodes for selectively emitting electrons, said plurality of cathodes being arranged in a row-column array and located in an x-y plane;

a substantially flat substrate having a surface, said substrate surface being oriented substantially parallel to said array of cathodes and separated by a distance therefrom;

a focusing magnet for establishing a magnetic field to direct electrons emitted from selected cathodes along substantially parallel respective electron paths to be focused on said substrate surface; and a steering magnet for influencing the magnetic field to selectively orient said electron paths at an inclination from a z direction to direct electrons from each cathode onto discrete pixels in a respective first pixel matrix on said substrate, the z direction being substantially perpendicular to the x-y plane, and wherein said steering magnet subsequently influences the magnetic field to digitally reorient said inclination of said electron paths to sequentially direct electrons from each cathode onto discrete pixels in a respective second pixel matrix on said substrate, said second pixel matrix of said cathode being a first pixel matrix of another said cathode.

2. A system as recited in claim 1 wherein each said cathode includes a gate electrode.

3. A system as recited in claim 1 wherein each said cathode includes a photodiode.

4. A system as recited in claim 1 wherein said steering magnet influences the magnetic field to sequentially direct electrons from each cathode onto discrete pixels in respective third, fourth and fifth pixel matrices on said substrate, said third, fourth and fifth pixel matrices of said cathode being a respective first pixel matrix of another said cathode.

5. A system as recited in claim 1 further comprising a layer of an electron resist material, said electron resist layer being coated onto said surface of said substrate.

6. A system as recited in claim 1 wherein the inclination of said electron paths includes a polar angle component ($\theta$) relative to the z direction, and an azimuthal angle component ($\phi$) to establish a projection of each said electron path, on said cathode array, each said projection being oriented to avoid overlying a cathode and minimize damage to said cathodes due to sputtering.

7. A system as recited in claim 1 further comprising:

a vacuum vessel for positioning said array of cathodes and said substrate therein;

a vacuum pump for producing a vacuum in said vessel of approximately $10^{-7}$ Torr; and a power supply for providing an acceleration voltage between said cathodes and said substrate in a range of approximately 1–10 kV.

8. A system as recited in claim 1 wherein said focusing magnet generates a uniform magnetic field having a field strength in the range of approximately 1–3 Tesla.

9. A system as recited in claim 1 wherein said focusing magnet is a dipole magnet.

10. A system as recited in claim 1 wherein said focusing magnet is a solenoid.

* * * * *

UNITED STATES PATENT AND TRADEMARK OFFICE
CERTIFICATE OF CORRECTION

PATENT NO.    : 6,014,203
DATED         : January 11, 2000
INVENTOR(S)   : Tihiro Ohkawa It is certified that error appears in the above-identified patent and that said Letters Patent is hereby corrected as shown below:

Column 6, Line 16
DELETE
[42bΔ]
INSERT
--42b"--

Column 7, Line 45
DELETE
[i'-y'-z']
INSERT
--x'-y'-z'--

Signed and Sealed this

Twenty-fifth Day of July, 2000

Attest:

Q. TODD DICKINSON

Attesting Officer

Director of Patents and Trademarks